(12) United States Patent
Brede et al.

(10) Patent No.: US 7,813,196 B2
(45) Date of Patent: Oct. 12, 2010

(54) INTEGRATED SEMICONDUCTOR MEMORY AND METHOD FOR OPERATING A DATA PATH IN A SEMICONDUCTOR MEMORY

(75) Inventors: Rüdiger Brede, Höhenkirchen (DE); Arne Heittmann, München (DE)

(73) Assignee: Qimonda AG, Munich (DE)

( * ) Notice: Subject to any disclaimer, the term of this patent is extended or adjusted under 35 U.S.C. 154(b) by 442 days.

(21) Appl. No.: 12/021,977

(22) Filed: Jan. 29, 2008

(65) Prior Publication Data
US 2008/0181039 A1 Jul. 31, 2008

(30) Foreign Application Priority Data
Jan. 30, 2007 (DE) .................. 10 2007 004 638

(51) Int. Cl.
*G11C 7/00* (2006.01)
(52) U.S. Cl. ...................... 365/202; 365/203
(58) Field of Classification Search .......... 365/202, 365/203
See application file for complete search history.

(56) References Cited

U.S. PATENT DOCUMENTS

| 4,404,660 | A | 9/1983 | Menachem |
| 6,343,038 | B1 * | 1/2002 | Makino et al. .......... 365/203 |
| 6,545,922 | B2 | 4/2003 | Nakazawa |

* cited by examiner

*Primary Examiner*—Son dinh
*Assistant Examiner*—Nam Nguyen
(74) *Attorney, Agent, or Firm*—Eschweiler & Associates, LLC

(57) ABSTRACT

An integrated semiconductor memory contains a multiplicity of bit line pairs which each comprise a first bit line and a second bit line. Sense amplifiers are each coupled to one of the bit line pairs for evaluating a signal on the first and second bit lines. A data line pair coupled to at least one of the multiplicity of bit line pairs for outputting a datum is furthermore provided. A correction device is connected on the output side to the data line pair or to at least one bit line pair. The device is embodied for feeding a correction signal onto the line pair.

21 Claims, 4 Drawing Sheets

INTEGRATED SEMICONDUCTOR MEMORY AND METHOD FOR OPERATING A DATA PATH IN A SEMICONDUCTOR MEMORY

REFERENCE TO RELATED APPLICATIONS

This application claims the benefit of the priority date of German application DE 10 2007 004 638.5, filed on Jan. 30, 2007, the contents of which are herein incorporated by reference in their entirety.

FIELD OF INVENTION

The invention relates to an integrated semiconductor memory, and to a method for operating a data path in a semiconductor memory.

BACKGROUND OF THE INVENTION

In integrated semiconductor memories which enable a multiple writing and reading operation, the increasing miniaturization of the individual circuits leads to an intensified influence of production-dictated parameter fluctuations on the signal processing. Thus, by way of example, changes with regard to the length or width of individual memory cells or transistors can lead to an alteration of the weak electrical signal present on a bit line during a read-out operation. At the same time, the need for higher processing speeds in semiconductor memories continues to rise.

The rising requirements may make it necessary, inter alia, for the individual steps which are required for a read-out operation or a writing operation, for example, to be precisely coordinated with one another temporally.

If too little time has elapsed between the operation of evaluating the signals on the bit lines of a sense amplifier and the transmission of the evaluated signals onto the data lines, fluctuations in the threshold voltage of a transistor of the sense amplifier can generate an incorrect datum on a data line.

In order to avoid faults of this type, the time period between the evaluation operation and the transmission onto the data line can be increased. However, this leads to a reduction of the speed during a reading operation and thus to slower access times to the memory.

Other faults within a semiconductor memory, for example defective memory cells or bit or word lines having an increased resistance, short circuit or high parasitic capacitance, can be corrected by redundancy circuits. In this case, by way of example, complete bit lines including the memory cells are replaced by redundant elements. However, the latter require additional space on the semiconductor memory, such that the available storage capacity per unit area is reduced again.

Although the parameter fluctuations are reduced by improved and more precise production methods, nevertheless the requirements made of the processing speed and the storage capacity in semiconductor memories simultaneously increase as well. Therefore, there is the need to be able to correct production-dictated parameter fluctuations without reducing the signal processing speed or the area required.

BRIEF SUMMARY OF THE INVENTION

The following presents a simplified summary in order to provide a basic understanding of one or more aspects of the invention. This summary presents one or more concepts of the invention in a simplified form as a prelude to the more detailed description that is presented later and is not an extensive overview of the invention. In this regard, the summary is not intended to identify key or critical elements of the invention, nor does the summary delineate the scope of the invention.

One object of the invention is to specify an integrated semiconductor memory with which parameter fluctuations are corrected. A further object of the invention is to specify a method for operating a data path in a semiconductor memory which enables a high signal processing speed.

These objects are achieved by means of the subject matter of the independent patent claims 1, 10 and 15. Developments and configurations of the invention emerge from the subclaims.

In one embodiment of the invention it is proposed to provide a correction device for the correction of such parameter fluctuations. Said correction device is configured for coupling in a correction signal onto a bit line pair or a data line pair. A parameter fluctuation that is possibly present is thereby corrected.

Thus, a semiconductor memory according to one configuration of the invention has a multiplicity of bit line pairs each comprising a first bit line and a second bit line. Sense amplifiers are respectively coupled to the multiplicity of bit line pairs for evaluating a signal on the first and second bit lines. A data line pair having a first data line and a second data line is provided for outputting a datum. Said data line pair is coupled to the sense amplifier. Moreover, a correction device connected on the output side to the data line pair or to at least one of the sense amplifier pairs is arranged in the integrated semiconductor memory according to the invention.

If a parameter fluctuation exceeds a threshold value and, if appropriate, causes a fault on the line pair coupled to the correction device, a correction signal can be fed onto the line pair by means of the correction device. The fault caused by the parameter fluctuation or a loss of speed caused by the parameter fluctuation is thereby corrected.

Faults which would not or would no longer be repairable by means of a configuration of additional, redundant components, for example bit lines and memory cells, can advantageously be compensated for. Moreover, parameter fluctuations leading to losses of speed during operation of a semiconductor memory can likewise be corrected. The flexibility with regard to the various correction possibilities for parameter fluctuations in an integrated semiconductor memory is advantageously increased.

What is suitable for correction of such a parameter fluctuation is, inter alia, a temporally limited correction current that is additionally fed to the line pair by means of the correction device. A defined quantity of charge is thereby applied to the line pair. The quantity of charge results from the product of the correction current and a time of feeding the correction current to the line pair. This can be effected for example by means of a transistor which can be switched by means of a control signal. For this purpose, one terminal of the transistor is connected to a terminal for a correction potential.

In another configuration, a fault caused by a parameter fluctuation or a loss of speed can be compensated for by capacitively coupling in a correction voltage signal onto the respective line pair. In this configuration it is conceivable to connect the line pair to an element having a capacitance. This enables the correction voltage signal to be coupled in onto the line pair.

A logic gate, for example a logic NAND gate, can be provided in the correction device. A control signal and an activation signal can be fed to the said gate on the input side. The activation signal serves for activating the correction device during the fabrication process for the semiconductor memory. Activation is preferably effected when a test measurement carried out has determined parameter fluctuations or faults caused thereby which lie above a threshold value. The correction device is therefore activated only when this appears to be necessary on account of the parameter fluctuations determined on the respective line.

In one configuration of the invention, the data line pair is connected to the at least one bit line pair via a first and a second transistor. The switching terminals are connected to a control line. Depending on parameter fluctuations in the case of said transistors, this can give rise to a different switching behavior during a reading or writing operation. Reading or writing errors are the consequence. The solution proposed can advantageously be used for correcting this parameter fluctuation by virtue of the correction device being coupled to the data line. For a correction, the correction signal and the switching signal on the control line are output substantially simultaneously. As an alternative it is possible to already activate the correction signal shortly before the switching signal on the control line.

In one configuration of the method, the signal present on the bit line pair is evaluated by the sense amplifier. During or after an evaluation, a correction signal is fed on the line pair. The line pair can be a bit line pair or else a data line pair. The data line pair is subsequently connected to the bit line pair for outputting the datum.

Likewise, the sense amplifier can be precharged with a first bias voltage. Afterward, the bit lines are coupled to the sense amplifier, and the signal situated on the bit lines is amplified and evaluated by said sense amplifier. The data lines are likewise precharged with a second bias voltage. A correction signal is transmitted onto at least one of the data lines and then the amplified signal is transmitted onto the data lines. The correction signal can be applied at the same time as the transmitting or else shortly before the transmitting of the amplified signal onto the data lines.

BRIEF DESCRIPTION OF THE DRAWINGS

The invention is explained in greater detail below on the basis of a plurality of exemplary embodiments illustrated in the drawings.

In the figures:

FIG. 2 shows a second exemplary embodiment of the invention with a correction device for capacitive coupling in.

DETAILED DESCRIPTION OF THE INVENTION

Figure 1:
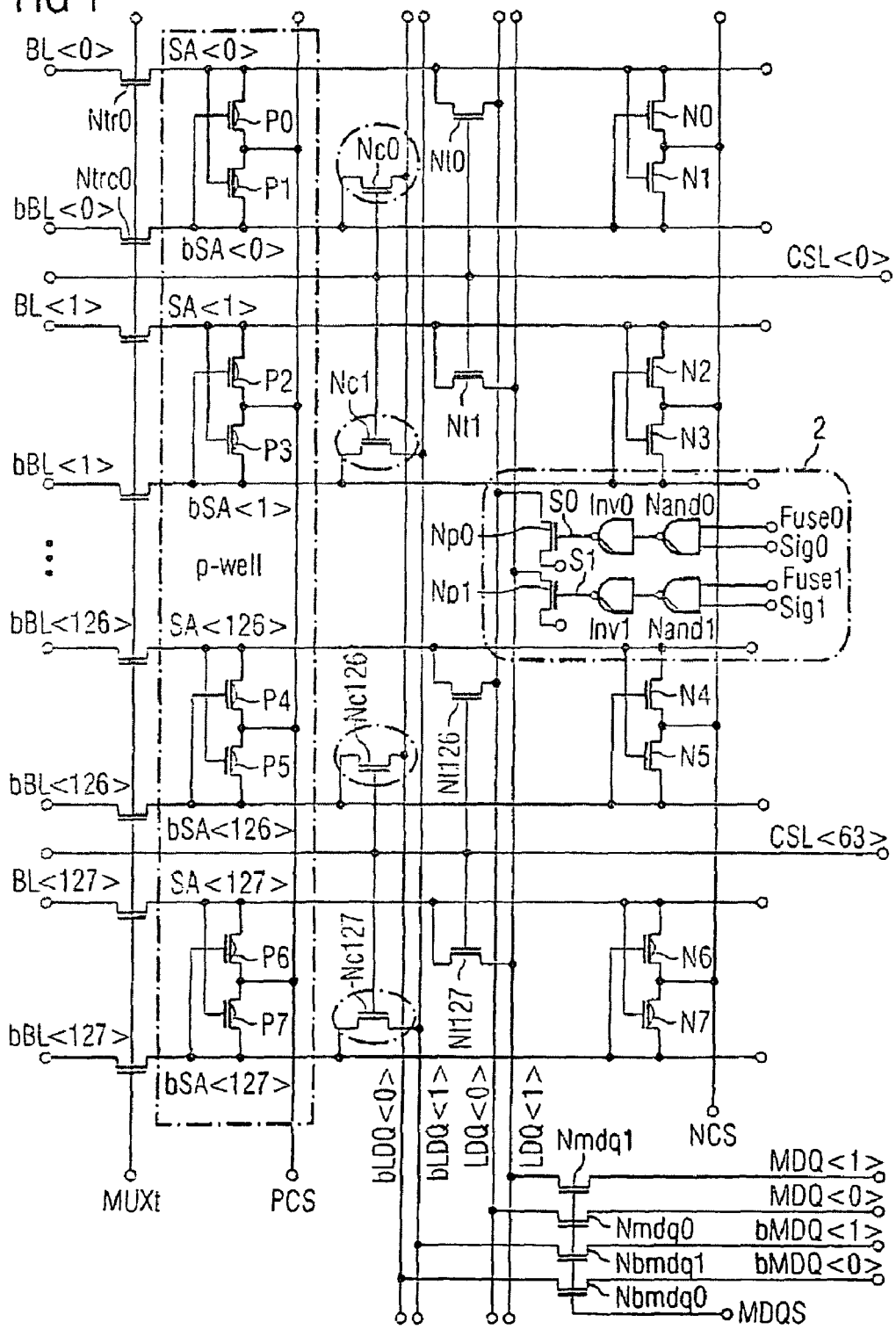
FIG. 1 shows a first exemplary embodiment of the invention with a correction device.

Further aspects and embodiments of the present invention are summarized in the description below. In addition, reference is made to the accompanying figures, which form part of the description and which use illustrations to show how the invention can be embodied in practice. The embodiments of the drawings represent a summary in order to enable a better understanding for one or more aspects of the present invention. This summary is not a comprehensive overview of the invention, nor does it intend to restrict the features or key elements of the invention to a specific embodiment. Rather, the different elements, aspects and features which are disclosed in the exemplary embodiments can be combined in different ways by a person skilled in the art in order to achieve one or more advantages of the invention. It should be understood that other embodiments could be used and that structural or logical changes could be made without departing from the central concept of the present invention. The elements in the drawings are not necessarily scaled in a manner true to scale with respect to one another. Identical reference symbols designate mutually corresponding similar parts.

Figure 5:
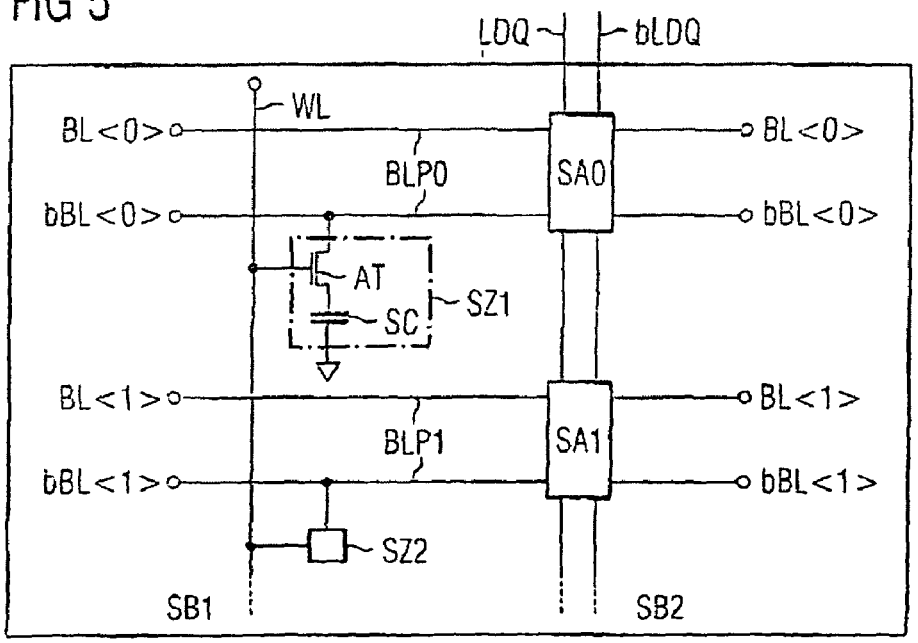
FIG. 5 shows an excerpt in schematic illustration of a semiconductor memory.

FIG. 5 shows an excerpt of a semiconductor memory. In this case, a plurality of memory cells, two of which are shown, are arranged at crossover points of bit lines BLT<0>, bBLT<0> or BLB, bBLB and word lines WL. A respective bit line BLT<0> and its associated complementary bit line bBLT<0> form a bit line pair BLP. The memory cells SZ1, SZ2 comprise a transistor AT, the control terminal of which is connected to the word line WL and the first terminal of which is connected to the respective bit line at the crossover point. The second terminal of the transistor AT leads to a storage capacitor SC. The latter can be formed for example as a trench capacitor.

Sense amplifiers SA0, SA1 are provided for reading out values stored in the memory cells SZ1, SZ2. In this case, each bit line pair BLP0, BLP1 is assigned a sense amplifier SA0 and SA1, respectively. The sense amplifiers SA serve for amplifying a weak electrical signal present at their input. Said electrical signal is dependent on the charges which are contained in the memory cells SZ1, SZ2 and which are transmitted onto the bit line after a signal on the word line WL. During a reading operation, for example, the sense amplifier SA0 evaluates the respective potential present on the bit lines of the bit line pair BLP0 and outputs said potential as a datum on the data lines LDQ, bLDQ. For the further bit line pairs the same holds true with the further sense amplifiers.

In the excerpt of a semiconductor memory illustrated in FIG. 5, each sense amplifier SA0, SA1 is assigned two memory cell arrays SB1, SB2. The latter are arranged symmetrically around the sense amplifier. Depending on which memory cell array is activated, the bit lines BL or bBL are connected to the sense amplifiers. Depending on the configuration of the integrated memory, a plurality of data lines can also be provided.

During fabrication, it is then possible for fluctuations in different parameters within the memory cell arrays to occur. Thus, by way of example, the individual storage capacitors SC of the memory cells SZ1, SZ2 can be formed differently. It is likewise possible for individual bit lines of the bit line pairs to have slightly different parasitic capacitances. Furthermore, it is conceivable for the amplifier transistors of the sense amplifiers for the individual bit lines or the switching transistors for the signal transmission onto the data line to be fashioned slightly differently. In the event of an evaluation operation during a read or write access to the individual memory cells, these parameter fluctuations could lead to an erroneous evaluation and hence an erroneous reading or writing operation.

In order to correct these parameter fluctuations, a correction circuit is provided according to the invention. FIG. 1 shows a concrete embodiment of such a correction circuit for the data lines LDQ<0> and LDQ<1>. An illustration with sense amplifiers for the bit line pairs BL<0>, bBL<0> to BL<127>, bBL<127> is shown. The bit line pairs are coupled to memory cells on the left-hand side (not illustrated here). Switching transistors Ntr0 and Ntrc0, respectively, are connected to each bit line of a pair. Said transistors are each connected to the control line MUXt. The control line MUXt and the switching transistors serve for coupling the sense amplifiers to the respective memory cell array and for decoupling them from the unrequited cell array.

The sense amplifiers each comprise a pair of PMOS and NMOS transistors P0, P1 and N0, N1, respectively. Said transistors are arranged between the two sense amplifier lines SA<0> and bSA<0>. Their control terminals are connected in each case complementarily to the sense amplifier lines. Thus, the control terminal of the PMOS transistor P0 and of the NMOS transistor N0 leads to the complementary sense amplifier line SA<0>. The control terminal of the transistors P1, N1 is connected to the sense amplifier line of the first pair and forms the sense amplifier node bSA<0> for the complementary bit line bBL<0>. The common terminal of the two PMOS transistors P0, P1 is connected to a signal line PCS. The common terminal of the transistors N0, N1 is correspondingly connected to a signal line NCS. A potential is fed to the amplifiers via the signal lines NCS and PCS, which will be explained in even more detail below.

The further sense amplifiers for the bit line pairs BL<1>, bBL<1> to BL<127>, bBL<127> are formed in the same way with PMOS and NMOS transistors.

The data lines LDQ<0>, bLDQ<0> and LDQ<1>, bLDQ<1> serve for reading out the signals on the respective bit lines of each pair. Said data lines are also referred to as local data lines.

For this purpose, the respective data lines are coupled to the bit lines of each line pair via transistors Nc0, Nt0 to Nc127, Nt127. The transistors are also referred to as bit switch transistors. Specifically, an NMOS switching transistor Nt0, . . . , Nt126 is arranged between the data line LDQ<0> and each bit line BL of each even-numbered bit line pair. In the present case, they are the bit line pairs 0, 2, 4, . . . , 126. The data line LDQ<1> is coupled to the bit line of each odd-numbered bit line pair via a second switching transistor Nt1, . . . , Nt127. The complementary data lines bLDQ<0> and bLDQ<1> are connected up in a corresponding manner. Thus, the switching transistors Nc0 to Nc126 couple the complementary bit line bBL of each even-numbered bit line pair to the data line bLDQ<0>. The complementary bit lines bBL of the odd-numbered bit line pairs are connected to the complementary data line bLDQ<1> via the bit switch transistors NC1 to NC127.

An even-numbered and an odd-numbered bit switch transistor pair Nc, Nt, which couple the data lines LDQ<0>, LDQ<1> to the corresponding bit lines, are in each case connected to a control signal line CSL<0> to CSL<63>. A control signal on the line CSL serves, during a reading operation, to open the corresponding switching transistors Nc, Nt and thus to transmit the signal present on the bit lines onto the local data lines LDQ, bLDQ.

During operation of a memory cell array constructed in this way, during the "precharge" phase, the first and second bit lines of each line pair are precharged to a mid-level voltage. The latter shall be 0.6 V, for example. During the "precharge" phase, the sense amplifier nodes SA<0> to SA<127>, bSA<0> to bSA<127> are likewise precharged to the mid-level voltage.

After a read command, those memory cells which are addressed by the activated word line (not illustrated here) are read. The charge stored in them is therefore transmitted onto the bit lines. As a result of the read-out of a memory cell, the voltage on the bit line respectively connected to the cell decreases or increases. By way of example, the voltage of the bit line BL<0> decreases by approximately 0.1 V if a logic "0" is stored in the opened memory cell. The voltage of the associated complementary bit lines bBL<0> remains at the original precharge voltage of approximately 0.6 V.

A few nanoseconds after the activation of the word line, the sense amplifiers with the transistors P0, N0 and P1, N1 are switched on. This is done by reducing the signal from the line NCS from the precharge voltage to the voltage 0 V. The signal on the line PCS is pulled from the precharge voltage to the voltage VBLH.

Depending on the respective voltage level on the bit lines, the transistors of the sense amplifiers then amplify the existing difference. As a result, one of the two bit lines BL or bBL is brought to 0 V, and the respective other bit line is brought to VBLH. In the above example, the node SA<0> of the first sense amplifier thereby "pulls" in the direction of 0 V, while the voltage on the complementary side bSA<0> is raised to the voltage VBLH.

A few further nanoseconds after the sense amplifiers were switched on, a control signal is output on one of the lines CSL, whereby the transistors Nc and Nt respectively connected to them open. The data lines are thereby coupled to the corresponding bit lines. This shall be the first control line CSL<0> in the present case.

For the reading operation, the local data lines LDQ, bLDQ and the associated master data lines MDQ, bMDQ are additionally precharged to a predetermined voltage.

Depending on the parasitic capacitance on the output or data lines, the precharge can have the effect that the sense amplifier which is now connected to the data line via the switching transistors Nc, Nt receives an additional signal. It shall be assumed as an example that the first sense amplifier attempts to pull in the direction of 0 V with the node SA<0> of the bit line BL<0> of the first bit line pair and in the direction of VBLH with the associated complementary node bSA<0>. The data line LDQ<0> and the data line complementary thereto are now charged to VBLH. When the two transistors Nc0, Nt0 are opened, this potential is transmitted to the first sense amplifier. Since the parasitic capacitance of the data lines LDQ, bLDQ is significantly greater than the parasitic capacitance of the nodes SA<0>, BSA<0> of the first sense amplifier, this has the effect that the two nodes of the first sense amplifier are pulled in the direction of VBLH.

A parameter voltage in the switching transistors Nc0 and Nt0 can then play an important part. Insofar as, for example, one of the two transistors has a higher threshold voltage, the corresponding potential on the local data line connected thereto is present more slowly at the associated node of the sense amplifier. As a result, "pulling" is effected more rapidly and more strongly at one node of the sense amplifier, whereby the sense amplifier can "toggle" in the incorrect direction during a reading operation. Ultimately the signal read out from the memory cells is evaluated incorrectly.

A similar incorrect evaluation can result on account of different channel resistances in the two transistors Nt0 and Nc0. This is caused primarily by layout-technological conditions resulting from the spatial arrangement of the bit switch transistors Nt, Nc with respect to the positively doped region "p-well" of the sense amplifiers.

The device 2 is provided for correcting such parameter fluctuations. Said device contains two switching transistors Np0, Np1 connected to the respective data line LDQ<0> and LDQ<1>. A predefined current or a defined quantity of charge can be fed to the data lines via the two transistors Np0 and Np1, respectively. For this purpose, the respective second terminals of the transistors Np0, Np1 are connected to a terminal for a correction potential. The circuit comprising the inverters Inv0 and Inv1, and the logic gates Nand0 and Nand1, respectively, serves for driving the two transistors. The output of the logic gates Nand0 and Nand1 is respectively coupled to an input of the inverters Inv0, Inv1. The inputs of the logic gates are connected to the signal terminals FUSE and SIG.

The signal on the lines FUSE0 and FUSE1 serves for activating and deactivating the corresponding correction circuit 2. In other words, an activation of the correction device is carried out only when this is necessitated by the parameter fluctuations of the elements connected to the data line. For this purpose, the fuses coupled to the signal terminals FUSE0 and FUSE1 are isolated during a test procedure of the semiconductor memory. During the test procedure, the parameter fluctuations are measured and an estimation about possible incorrect evaluations is effected.

During a corresponding reading or writing access, the pulsed signals SIG0 and SIG1 are then chosen in such a way that they open the transistors Np0 and Np1 respectively coupled to them for a predetermined time. As a result, a predefined current flows onto the corresponding data line for a predetermined time. As a consequence, this results in a change in the potential or the voltage on the local data lines LDQ<0> and LDQ<1>. The pulse length of the signals SIG0 and SIG1 is chosen in such a way that the parameter fluctuation, for example an increased threshold voltage of the transistors Nc or Nt, is precisely compensated for. The applied quantity of charge Q results from the product of the correction current through the transistors Np0, Np1 and the pulse length of the signal SIG0 and SIG1, respectively. The parameter fluctuation is corrected by the change in the potential on the data line, such that for example the increased threshold voltage of the transistors Nt0, Nt127 is compensated for in the present embodiment.

There are various possibilities for the point in time of the correction of the potential on the data line. By way of example, the signals SIG0 and SIG1 can be effected essentially simultaneously with the switch-on signal of the sense amplifiers. As an alternative, it is possible to activate them jointly with the corresponding control signal on the lines CSL. The speed is increased by the correction of the parameter fluctuation by means of the additional signal. It is thus possible for example to reduce the time period between the activation of the sense amplifiers and the activation of the bit switch transistors by means of the switching signal on the line CSL.

During the manufacturing process, the parameter fluctuations are measured. For this purpose, a test system is provided generating several test pattern for the semiconductor memory device. The test pattern is stored in the memory cells before performing read and write operations. During those test different timing parameters for signals on lines MUXt, PCS, NCS, DQs and so forth are used. In addition, voltage deviations as well as refresh deviations are simulated in order to recognize the above mentioned parameter fluctuations resulting in erroneous read or write operations.

If there are some fluctuations, fuses connected to lines FUSE0 and FUSE1 are shot, thereby enabling the correction circuit. Then, some tests are repeated or different test are performed to receive information about parameters required to correct the fluctuations. For instance, a pulse width is determined for a signal at lines Sig1 and Sig0, which is required to correct the fluctuations.

After all necessary information is retrieved, the parameters required for the correction signals are stored in some buffer within the memory device. Such parameter may include the pulse width for the correction signals to be applied to logic gates NAND0 and NAND1.

Figure 2:
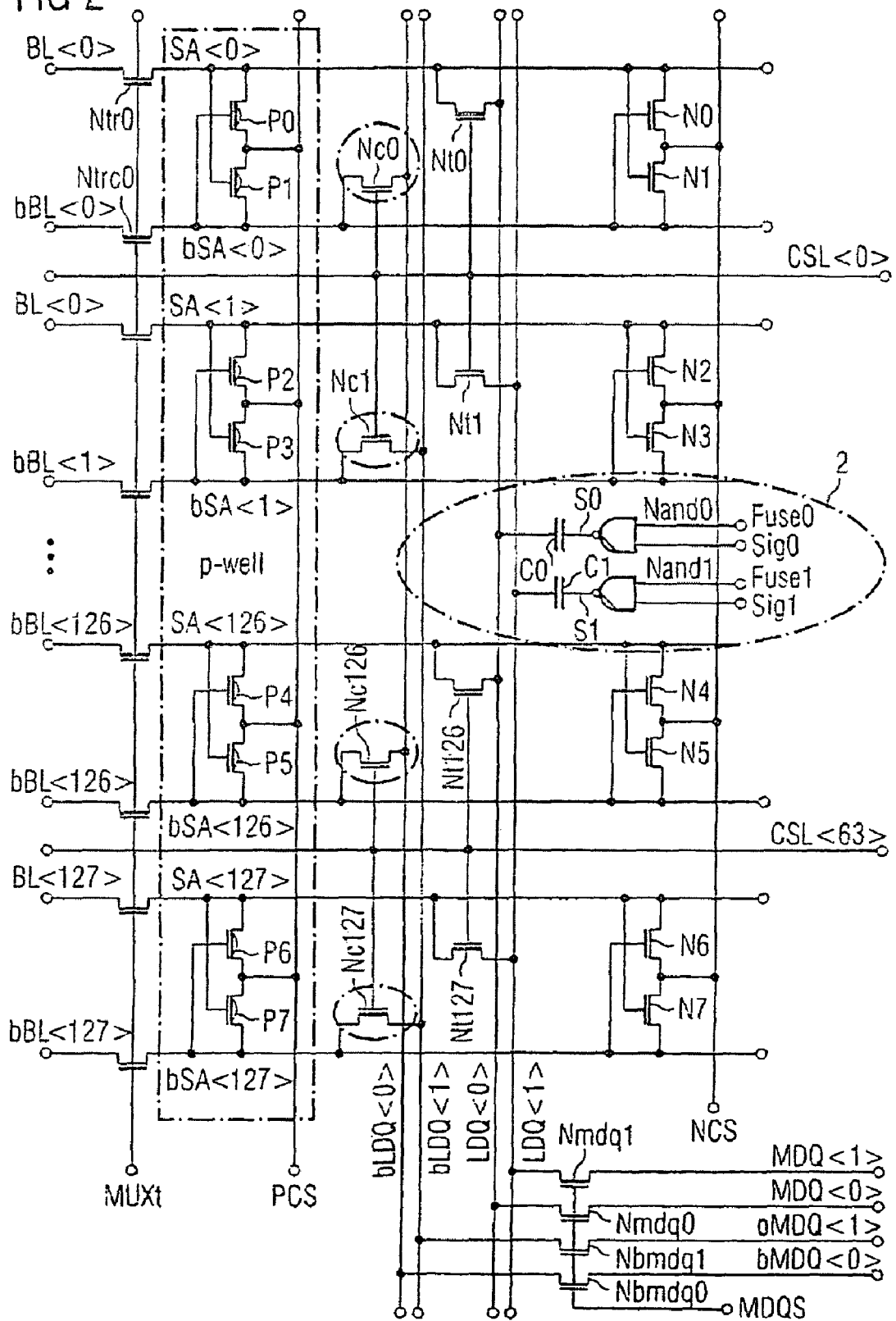

FIG. 2 shows an alternative configuration of the correction device 2 for correction of the potentials on the data lines LDQ<0>, LDQ<1>. In this case, a capacitive coupling in of voltage is effected as correction signal. For this purpose, the data lines are coupled to a terminal of a capacitor C0 and C1, respectively. The second terminal of the respective capacitor is connected to a logic NAND gate Nand0 and Nand1, respectively.

For correction of individual parameter fluctuations, the signals SIG0 and SIG1 are fed to the logic gates. The control signals S0, S1 generated by the gates can bring about a change in the voltage across the capacitors C0 and C1, respectively. Depending on the size of the capacitors, the potential on the data lines can change in such a way that a parameter fluctuation of the elements connected to the data line is corrected.

In the example of an increased threshold voltage of the bit switch transistors Nc0 and Nc1, a correction by means of the control signal Sig0 has the effect that the overall effect of the potential on the data lines LDQ<0> and the complementary data line bLDQ<0> becomes equal in magnitude. In this way, the evaluation operation of the sense amplifier is not disturbed when the local data line is coupled to the sense amplifier, and an incorrect evaluation is prevented.

At the same time, with a correction on the data lines, it is possible to reduce the period of time between the activation of the sense amplifiers and the activation of the switching transistors Nc, Nt by means of the control signal on the control lines CSL. The speed for a reading operation is thus increased.

The correction device 2 illustrated here can, of course, also be applied to the complementary bit lines. In addition, it is possible to provide further correction devices elsewhere.

Figure 3:
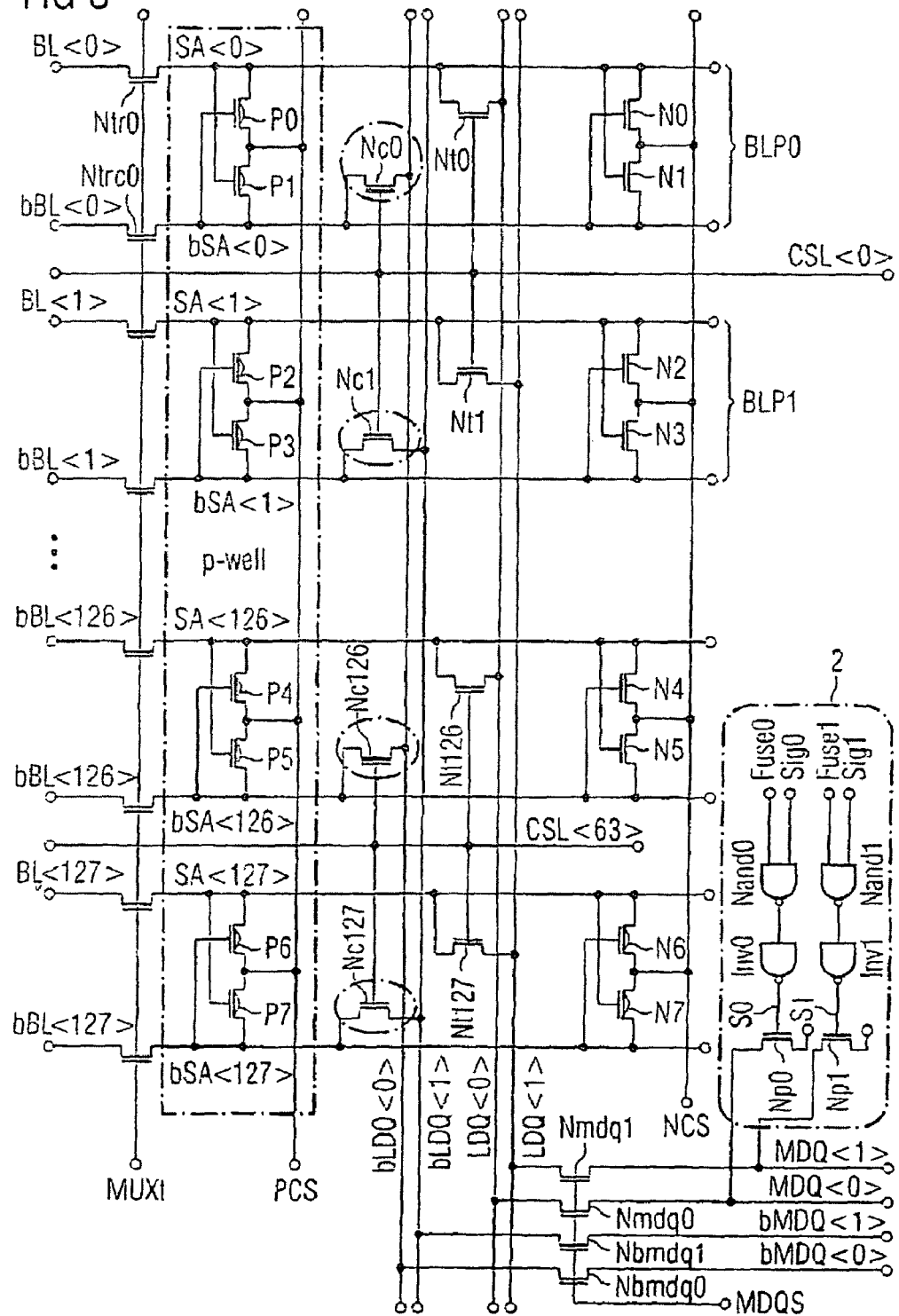
FIG. 3 shows a third exemplary embodiment of the invention with a correction device.

An example of this type is illustrated in FIG. 3. In this embodiment, fault compensation and hence correction of parameter fluctuations are performed at a different part of the output data path. In the present case, the correction device 2 is connected to the master data lines MDQ<0> and MDQ<1>. The latter are connected via switching transistors Nmdq0, Nmdq1, Nbmdq0, Nbmdq1 to the local data lines LDQ<0>, LDQ<1> and the complementary data lines bLDQ<0>, bLDQ<1>. The master data lines MDQ, bMDQ are additionally connected to further sense amplifiers (not illustrated here) which, in the event of a read access, evaluate and amplify a voltage difference between the master data line and a complementary master data line. By applying a defined quantity of charge to the master data lines with the aid of the transistors NP0 and NP1, it is possible for example to correct a systematic fault in the additional sense amplifiers.

Figure 4:
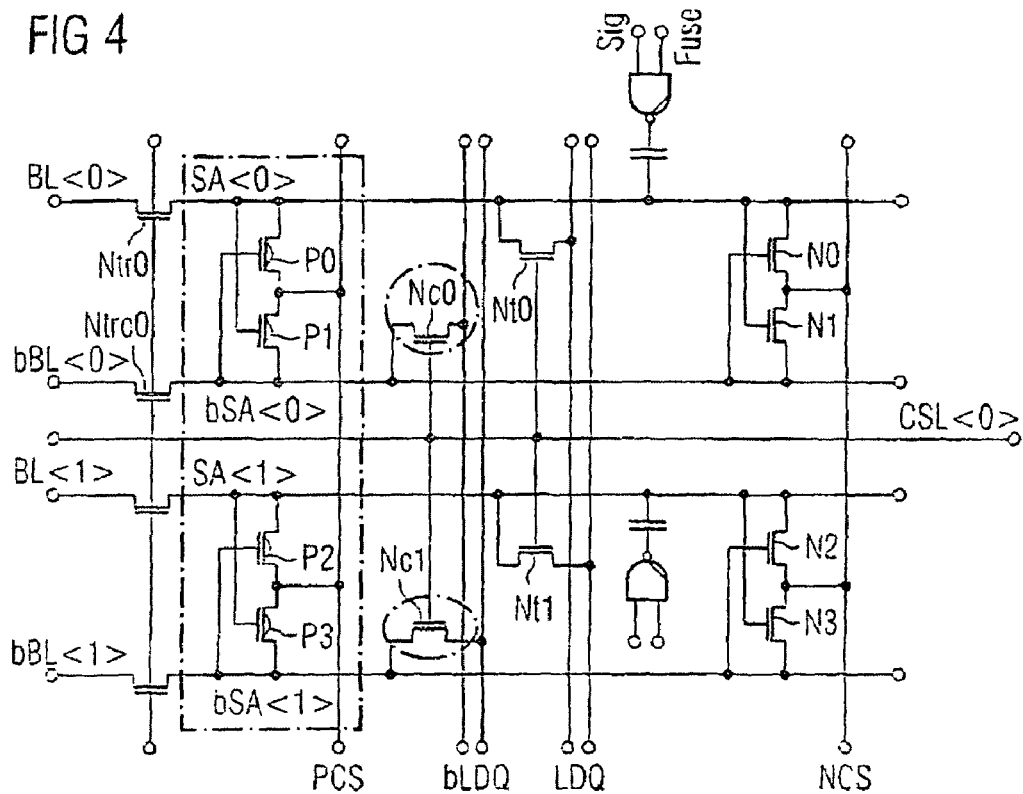
FIG. 4 shows a fourth exemplary embodiment of the invention with a correction device for the bit lines and sense amplifiers.

FIG. 4 shows a further embodiment. In this configuration, a correction signal is coupled in capacitively on the sense amplifier lines rather than on the data lines LDQ. In addition, the correction signal can also be coupled in on the bit lines BL of a bit line pair. This configuration is advantageous particularly when the transistors Ntr0 and Ntrc0 have differences, for example different threshold voltages, on account of parameter fluctuations. The transistors of the sense amplifiers may likewise have different threshold voltages, which can be corrected in this way. By means of the additional capacitive coupling in of a correction voltage signal, said difference is corrected and a precise evaluation by the sense amplifiers is thus made possible.

In the case of the invention, additional correction devices are provided at various locations of an integrated semiconductor memory, said correction devices correcting parameter fluctuations of critical circuit-internal elements. For this purpose, parameter fluctuations and possible fault sources which lead to a reduction of the signal processing speed are localized during fabrication and a test phase. Besides replacing possible word and/or bit lines by correspondingly provided redundancy lines, signals can additionally be coupled in by the correction device in order to compensate for these parameter fluctuations. They can be voltage signals, for example. As an alternative, charges can be introduced or led away via transistors. The correction device can thus be used to correct for example transistor threshold voltage fluctuations, fluctuations of the width or length and of the parasitic capacitance of individual transistors and/or lines.

Although specific embodiments have been illustrated and described herein, it will be appreciated by those of ordinary skill in the art, that any arrangement which is calculated to achieve the same purpose may be substituted for the specific embodiments shown. It is to be understood, that the above description is intended to be illustrative and not restrictive. This application is intended to cover any adaptations or variations of the invention. Combinations of the above embodiments and many other embodiments will be apparent to those of skill in the art upon reading and understanding the above description. The scope of the invention includes any other embodiments and applications in which the above structures and methods may be used. The scope of the invention should, therefore, be determined with reference to the appended claims along with the scope of equivalents to which such claims are entitled.

The invention claimed is:

1. An integrated semiconductor memory, comprising:
a multiplicity of bit line pairs which each comprise a first bit line and a second bit line;
a multiplicity of sense amplifiers which are each coupled to one of the multiplicity of bit line pairs for evaluating a signal on the first and second bit lines;
a data line pair for providing a datum, wherein the data line pair is coupled to at least one of the multiplicity of bit line pairs, and wherein the data line pair comprises a first data line and a second data line; and
a correction device connected on an output side to the data line pair, to at least one bit line pair, or to a sense amplifier node, wherein the correction device feeds a correction signal to the data line pair, one of the multiplicity of bit line pairs, or one of the multiplicity of sense amplifiers.

2. The semiconductor memory of claim 1, wherein the correction device feeds a temporally limited correction current onto the data line pair or one of the multiplicity of bit line pairs.

3. The semiconductor memory of claim 1, wherein the correction device has at least one transistor which can be switched by means of a control signal and which is connected to a line of the data line pair or one of the multiplicity of bit line pairs, and to a potential terminal.

4. The semiconductor memory of claim 1, wherein the correction device has a capacitor for capacitively coupling a correction voltage signal onto the data line pair or one of the multiplicity of bit line pairs.

5. The semiconductor memory of claim 1, wherein the correction device has a logic gate to which a control signal and an activation signal can be fed on an input side.

6. The semiconductor memory of claim 1, wherein the data line pair is coupled to the at least one of the multiplicity of bit line pairs via a first and second transistor, and wherein the switching terminals of the first and second transistor are connected to a control line.

7. The semiconductor memory of claim 1, wherein one of the multiplicity of bit line pairs is connected to an associated sense amplifier of the multiplicity of sense amplifiers via a respective switching transistor pair.

8. The semiconductor memory of claim 7, wherein the correction signal and a switching signal are effected substantially simultaneously on a control line.

9. The semiconductor memory of claim 1, wherein the multiplicity of sense amplifiers each have a first series circuit comprising a first transistor pair of a first conductivity type and a second series circuit comprising a second transistor pair of a second conductivity type, which are arranged between the first and second bit lines and the control terminals of which are connected to the second and first bit lines connected to the respective other transistor of the first or second transistor pair.

10. An integrated semiconductor memory having components, the components comprising:
a word line;
a bit line pair;
a memory cell arranged at a crossover of the word line and a bit line of the bit line pair;
a sense amplifier connected to the bit line pair, wherein the sense amplifier evaluates a signal on the bit line pair and generates an evaluation signal;
a data line pair coupled to the bit line pair; and
a correction device for generating a correction signal, wherein the correction device outputs a correction signal to at least one of the components during a reading or writing operation, in order to compensate for parameter fluctuations;
wherein the parameter fluctuations are present in at least one of the components of the integrated semiconductor memory, and wherein the parameter fluctuations lead to an erroneous read or written datum during the reading or writing operation of the integrated semiconductor memory.

11. The integrated semiconductor memory of claim 10, wherein the correction device is coupled to the data line pair.

12. The integrated semiconductor memory of claim 10, wherein the correction device is coupled to the bit line pair.

13. The integrated semiconductor memory of claims 10, wherein the correction device comprises a capacitor, and wherein the capacitor capacitively couples in a voltage correction signal to the components.

14. The integrated semiconductor memory of claims 10, wherein the correction device comprises a transistor for transmitting a correction current to the components.

15. The semiconductor memory of claims 14, wherein the correction device has a logic gate which, on an output side, is connected to the capacitor or to a control terminal of the transistor.

16. The integrated semiconductor memory of claims 10, wherein the parameter fluctuations represent a deviation relative to a provided value in at least one of the following features:
a geometrical dimension in a plurality of transistors of the sense amplifier;
a capacitance of the plurality of transistors of the sense amplifier;
a geometrical dimension of memory cell;
a capacitance of at least one bit line of the bit line pair;
a capacitance of a data line of the data line pair;
a geometrical dimension of a switching transistor for coupling a data line to a bit line;
a threshold voltage of a switching transistor for coupling a data line to a bit line;
a threshold voltage of a transistor in the data path.

17. A method for operating a data path in a semiconductor memory, comprising:
- precharging a sense amplifier with a first bias voltage;
- coupling one or more bit lines to the sense amplifier;
- amplifying and evaluating a signal situated on the one or more bit lines;
- precharging one or more data lines with a second bias voltage;
- generating a correction signal and applying the correction signal onto at least one of the one or more data lines; and
- transmitting an amplified signal onto the one or more data lines.

18. The method of claim 17, wherein the correction signal is applied before or during the transmitting of the amplified signal onto the one or more data lines.

19. The method of claim 17, wherein the correction signal is applied as a quantity of charge by virtue of a correction current flowing for a predetermined time onto at least one of the one or more data lines.

20. The method of claim 17, wherein a voltage across a capacitor is applied as the correction signal to the at least one of the one or more data lines.

21. The method of claims 17, wherein for the transmitting of the amplified signal, the one or more data lines are coupled to the sense amplifier via switches.

* * * * *